Oct. 17, 1950 R. W. HARRALSON 2,526,353
STABILIZED LOW-FREQUENCY OSCILLATOR
Filed Nov. 15, 1946
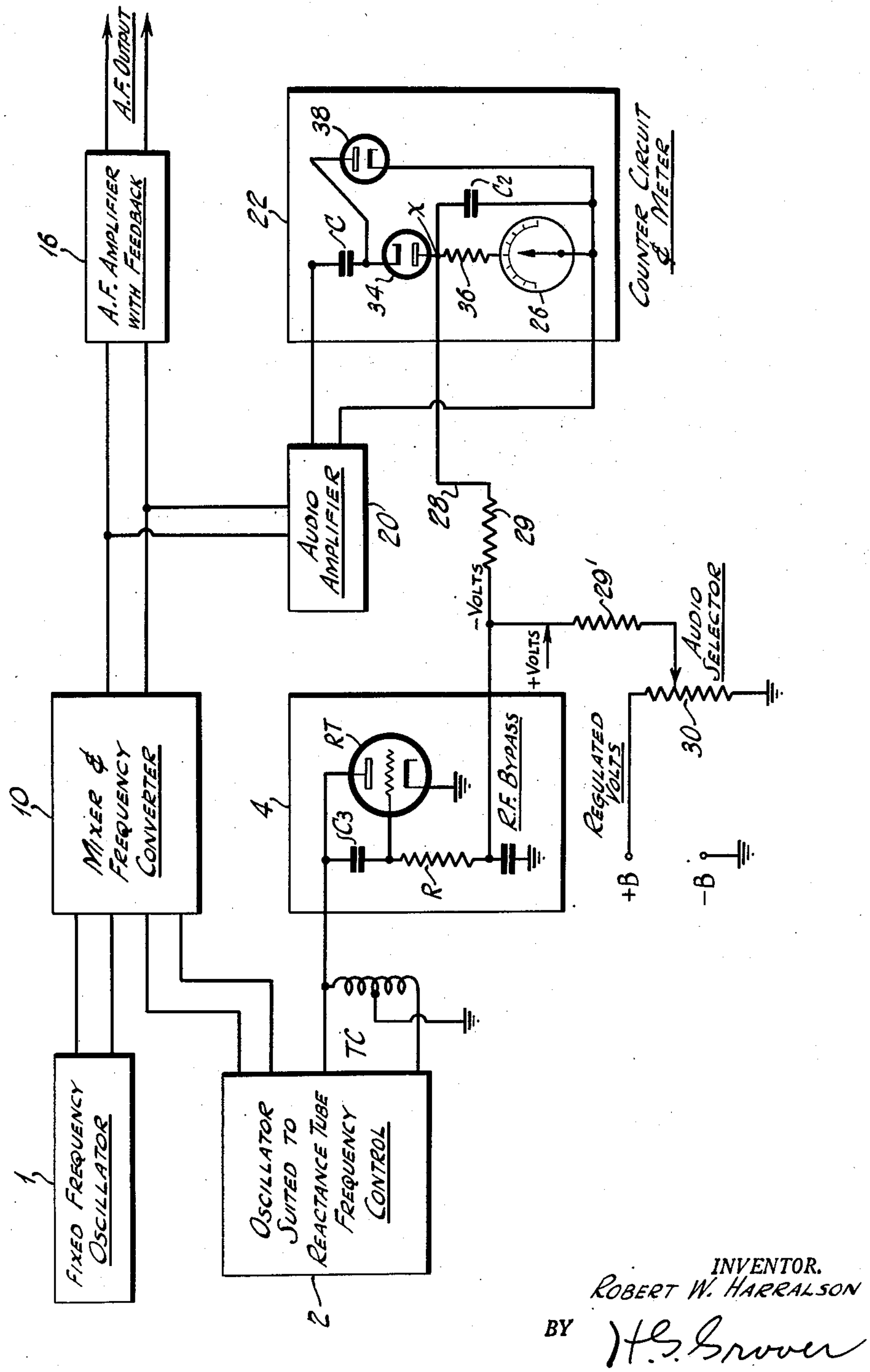
INVENTOR.
ROBERT W. HARRALSON
BY H. S. Grover
ATTORNEY.

Patented Oct. 17, 1950 2,526,353

UNITED STATES PATENT OFFICE 2,526,353

STABILIZED LOW-FREQUENCY OSCILLATOR

Robert W. Harralson, Masonville, N. J., assignor to Radio Corporation of America, a corporation of Delaware Application November 15, 1946, Serial No. 710,027

2 Claims. (Cl. 250—36)

This application discloses a new and improved method and means for generating oscillations of audio frequency which are continuously variable through a wide range, with means for indicating at all times the true frequency of the oscillations generated.

Audio frequency oscillators of this type have a wide use in the radio and allied arts, as tone generators for testing equipment for producing synchronizing potentials and so forth.

Audio oscillation generators are known in the art and may be separated into two general types. One of these types is known in the art as a beat frequency oscillator, while the other is known in the art as a resistance and capacity coupled oscillator. My invention pertains to oscillators of the first type.

Beat frequency oscillators as known today have these and other limitations. (A) The frequency stability is poor for low audio frequencies. This is because the audio oscillations are derived by beating together oscillatory energy from two sources of higher frequency. If the frequency of either of the primary oscillators used in the beating process changes even a slight amount, a corresponding frequency change occurs in the beat note, and this change is a large percentage of the beat frequency, producing uncertainty in the operator's mind as to the true frequency, with consequent frequent checking of the zero calibration point. (B) In beat frequency oscillators known heretofore, expensive components are needed to produce even moderate stability. The oscillators usually are not completely stabilized. Efforts are made to have both of the primary oscillators drift in frequency in the same direction, so that the beat note is constant. This, of course, is difficult in practice. Moreover, in these systems, accuracy of the dial calibration depends on various factors, including a very accurate tuning condenser, which is also very expensive.

The resistance capacity (variable) type oscillators depend on band switching to cover the audio frequency range. In these systems, when one range is run through, the operator has to turn the condenser clear back to its original position to run through the next range. Here again, an expensive capacity is essential for true frequency readings on the condenser dial. Moreover, the resistors of the generator network are not stable in operation, even when the most expensive type available is used. Zero setting is unstable because of circuit element instability.

My object is to provide a beat frequency oscillator of simple construction, in which the drift is diminished by automatic frequency control means, and wherein indications of the true frequency are provided at all times regardless of drift in frequency of one of the beating oscillators.

A further object of my invention is to provide a beat frequency oscillator of simplified construction, in which the whole audio frequency range may be covered with one turn of the dial without the need of switching and in which frequency stabilization is carried out, and, of first importance, wherein the true frequency is always indicated on the dial.

In describing my invention, reference will be made to the attached drawing, wherein the single figure illustrates schematically, partly by block diagram and partly by circuit element and circuit element connections, a beat frequency oscillator arranged in accordance with my invention.

In the drawing, the rectangle 1 includes a source of oscillatory energy of fixed frequency such as, for example, a crystal controlled oscillator and a multiplier, if desired. 2 represents an oscillation generator suited to frequency control, such as would be had by using as a frequency determining reactance, a controllable tube reactance. The tube reactance is represented as being included in the unit 4. It will be obvious to those skilled in the art that other tuning means may be used here.

The rectangle 10 includes a mixer and frequency converter and detector wherein oscillatory energy from the sources 1 and 2 is beat together and the difference frequency selected and supplied as output to the audio amplifier in 16. The audio amplifier in 16 preferably includes degenerative feed-back to reduce distortion in the output, which here is the useful output. The amplifier in 20 is used in case sufficient voltage is not available in the output of unit 10. If the wave is not of constant amplitude, the unit 20 may also include an amplitude limiter. If the output of 10 and/or 20 is of constant amplitude, it may be of sine wave form and in any case, is supplied to the input of a counter circuit in unit 22. The counter circuit in unit 22 includes a frequency meter 26. The counter circuit and frequency meter arrangement, in addition to producing indications of the beat frequency out of 10, also supplies an automatic frequeny control potential to lead 28 and thence, by resistor 29 to a control electrode in the reactance tube circuit of unit 4. This circuit also includes a resistor 29 connected by resistor 29' to a tap on potentiometer resistor 30 connected between ground and the positive terminal of a regulated voltage source. The movable point on this potentiometer is the means for changing the frequency of the developed audio oscillations as desired through a wide range of frequencies.

The circuit elements and element connections in the units 1, 2, 10, 16 and 20 may be conventional and the connections are so well known in the prior art as to make it inadvisable to include discussions of details thereof herein.

The counter circuit in unit 22 per se may be to some extent conventional, with improvements which are to be discussed herein, since it is an essential feature of my novel combination. This counter circuit may comprise a condenser C, diode 34, rectifier or diode load resistor 36 and meter 26 in series in shunt to the output of the amplifier 20. A second diode 38 is connected in reverse polarity in shunt to the diode 34, load resistor 36 and meter 26. Load resistor 36 and meter 26 are shunted by condenser C2.

The potential at X varies approximately as the logarithm of the frequency of the oscillations out of the unit 20. This is because a negative half cycle potential excursion out of the amplifier in 20 causes current to be drawn by diode 34 through the load resistor 36 and meter 26 to produce a negative potential at the point X. The positive half-cycles discharge condenser C through diode 38 but have no effect on the potential at X. The voltage at X therefore is a function of the repetition rate of the voltage out of the amplifier 20, as long as the potential at point X is small compared to the peak voltages applied from the output of amplifier 20, because the amount of current which flows through condenser C depends on the difference between the voltage at 20 and at X. I propose to let the voltage at X rise so that the response will not be linear with frequency but will more nearly vary as the logarithm of the frequency of the recurring potentials at the output of unit 20. This is accomplished by proper dimensioning of capacitors C and C2 and resistor 36.

The potential at the point X, which is negative, is also supplied by lead 28 to the series resistors 29 and R and thence to the control grid of the reactance tube RT. The relative frequencies of the oscillators 1 and 2, and these oscillators and the reactance tube RT, are so arranged that applied positive voltage on the reactance tube grid causes the generated audio frequency to increase, developing negative voltage in the counter and at point X which tends to restore the original condition. A few volts change on the reactance tube (say 5 or 10) is enough to produce the full audio range. If this control voltage is made the difference of two large voltages, one positive as from potentiometer 30 and the other negative as from the counter at point X, the frequency will be accurately determined by the amount of positive volts selected from resistor 30. The maximum D. C. volts from the counter may be in the neighborhood of 100 to 200, with a corresponding amount of voltage taken from potentiometer 30.

The operator then, by merely adjusting the point labeled Audio Selector on potentiometer 30, and observing the meter 26 may supply as output oscillations of known audio frequency, the frequency of which may be changed through a wide range as desired. Moreover, the operator is certain at all times that the output frequency will agree with the meter reading and that any selected frequency may be returned to at any time.

What is claimed is:

1. An audio frequency wave generator comprising in combination, a source of oscillations of fixed frequency, an oscillation generator of controllable frequency, the frequencies of the source and generator being such that a beat note resulting from mixing the same is in the audible frequency range, an electronic reactance, having electrodes between which a reactive effect is developed, included as a frequency determining reactance of said oscillation generator, said reactance also having a control electrode the potential on which determines said reactance, a mixer and converter stage coupled to said oscillation source and oscillation generator, an output circuit coupled to said converter, a cycle counter circuit coupled to said converter stage output circuit, said cycle counter comprising a resistor wherein is developed a potential which changes with changes in the frequency of operation of the oscillation generator, a meter connected to said resistor, and a frequency control circuit connecting said resistor to said control electrode in said reactance.

2. In a variable audio frequency current generator, a source of oscillations of fixed frequency, an oscillation generator of controllable frequency, the frequency of the source and generator being such that a beat note resulting from mixing the same is in the audible frequency range, an electronic reactance, having electrodes between which a reactive effect is developed, included as a frequency determining reactance of said oscillation generator, said reactance also having a control electrode the potential on which determines said reactance, a mixer and frequency converter stage coupled to said oscillation source and oscillation generator, an output circuit coupled to said converter, a cycle counter circuit coupled to said converter stage, said cycle counter comprising a capacitor, a rectifier and a resistor in series coupled to said output circuit, a rectifier in shunt to said first rectifier, said rectifiers having their electrodes in opposed relation, whereby a potential is developed in said resistor which changes with changes in the frequency of operation of the oscillation generator, a meter in series with said resistor, a storage capacitor in shunt to said resistor and meter, and a frequency control circuit connecting asid resistor to said control electrode in said reactance.

ROBERT W. HARRALSON.

REFERENCES CITED

The following references are of record in the file of this patent:

UNITED STATES PATENTS

| Number | Name | Date |
|---|---|---|
| 2,099,156 | Wheeler | Nov. 16, 1937 |
| 2,248,442 | Stocker | July 8, 1941 |
| 2,307,316 | Wolff | Jan. 5, 1943 |
| 2,316,317 | Curtis | Apr. 13, 1943 |
| 2,406,125 | Ziegler et al. | Aug. 20, 1946 |
| 2,406,309 | Ziegler | Aug. 20, 1946 |